(12) United States Patent
Hersman et al.

(10) Patent No.: US 10,348,057 B2
(45) Date of Patent: Jul. 9, 2019

(54) SYSTEM AND METHOD FOR HIGH POWER DIODE LASER WAVELENGTH SPECTRUM NARROWING

(71) Applicant: UNIVERSITY OF NEW HAMPSHIRE, Durham, NH (US)

(72) Inventors: William Hersman, Durham, NH (US); Michael Hersman, Manhattan Beach, CA (US)

(73) Assignee: UNIVERSITY OF NEW HAMPSHIRE, Durham, NH (US)

( * ) Notice: Subject to any disclaimer, the term of this patent is extended or adjusted under 35 U.S.C. 154(b) by 0 days.

(21) Appl. No.: 15/875,270

(22) Filed: Jan. 19, 2018

(65) Prior Publication Data

US 2018/0205201 A1 Jul. 19, 2018

Related U.S. Application Data

(60) Provisional application No. 62/499,185, filed on Jan. 19, 2017.

(51) Int. Cl.
*H01S 5/14* (2006.01)
*H01S 5/40* (2006.01)
*H01S 3/08* (2006.01)

(52) U.S. Cl.
CPC ............ *H01S 5/141* (2013.01); *H01S 5/4025* (2013.01); *H01S 5/4068* (2013.01); *H01S 3/08027* (2013.01); *H01S 5/4062* (2013.01)

(58) Field of Classification Search
CPC .......... H01S 5/14; H01S 5/141; H01S 5/4025; H01S 5/065
See application file for complete search history.

(56) References Cited

U.S. PATENT DOCUMENTS 4,862,101 A * 8/1989 Emmons .................. G01J 3/12
359/345
4,983,844 A 1/1991 Korevaar
(Continued)

OTHER PUBLICATIONS

Keaveney, James, et al., A single-mode external cavity diode laser using an intra-cavity atomic Faraday filter with hort-term linewidth <400 kHz and long-term stability of <1 MHz, Review of Scientific Instruments 87, 0951111,4 rages. (Year: 2016).*

(Continued)

*Primary Examiner* — Armando Rodriguez
(74) *Attorney, Agent, or Firm* — Grossman, Tucker, Perreault & Pfleger, PLLC

(57) ABSTRACT

A high power diode laser system selects the central wavelength and narrows the spectral bandwidth by employing one or more atomic line filters (ALFs) as the wavelength selective element in the external cavity to optimize high power multi-mode operation. The high power diode laser system may include multiple diode laser sources, such as multiple diode laser bar stacks, providing multiple output beams. In an "in-line" or "straight through" configuration, a partially reflective surface terminates the external cavity to feed beam power back through the external cavity and to provide one or more output beams. In a "splitter" or "power divider" configuration, a highly reflective surface terminates the external cavity and one or more beam splitters between the diode laser source(s) and the ALF are used to provide one or more output beams. An afocal telescope may be used to image the diode laser source(s) at the reflective surface terminating the external cavity.

24 Claims, 2 Drawing Sheets

(56) References Cited

U.S. PATENT DOCUMENTS

| | | | | |
|---|---|---|---|---|
| 5,731,585 | A * | 3/1998 | Menders | H04B 10/118 250/382 |
| 6,584,133 | B1 * | 6/2003 | Walker | H01S 5/4062 372/101 |
| 7,769,068 | B2 | 8/2010 | Hersman et al. | |
| 9,780,522 | B2 | 10/2017 | Hersman et al. | |
| 2014/0133515 | A1 * | 5/2014 | Hersman | H01S 3/0941 372/75 |

OTHER PUBLICATIONS

Keaveney, James, et al., A single-mode external cavity diode laser using an intra-cavity atomic Faraday filter with short-term linewidth <400 kHz and long-term stability of <1 MHz, Review of Scientific Instruments 87, 0951111, 4 pages, Sep. 30, 2016.

* cited by examiner

SYSTEM AND METHOD FOR HIGH POWER DIODE LASER WAVELENGTH SPECTRUM NARROWING

CROSS-REFERENCE TO RELATED APPLICATIONS

This application claims the benefit of U.S. Provisional Patent Application Ser. No. 62/499,185, filed on Jan. 19, 2017, which is fully incorporated herein by reference.

TECHNICAL FIELD

The present disclosure relates to selecting the central wavelength and narrowing the spectral bandwidth in high power diode laser systems and more particularly, to using an atomic line filter to select the central wavelength and narrow the spectral bandwidth of high power diode laser stacks.

BACKGROUND INFORMATION

Optical pumping of alkali vapors in gases has found increasingly diverse applications in science, medicine and military defense. In basic science, for example, measurements of the substructure of protons and neutrons were enabled by producing polarized nuclei of helium-3 by Spin Exchange Optical Pumping (SEOP). In diagnostic medicine, SEOP was applied to hyperpolarize the nuclei of both helium-3 and xenon-129 for uses in magnetic resonance imaging of pulmonary function. For both these applications, laser light tuned to the absorption wavelength of the D1 line in rubidium at 795 nm is circularly polarized and directed to illuminate mixed gases saturated with rubidium vapor in a magnetic field, causing the rubidium electron to become polarized. Through collisions with helium-3 or xenon-129, the angular momentum is transferred to the nuclei of these atoms, making them nuclear-polarized. These applications benefit from a new and growing class of lasers with selectable central wavelength and linewidth narrowed from their natural width of 3 nm to a narrowed level of 0.2 nm or less, with power ranging from hundreds of watts to a few kilowatts. Efforts are ongoing to further reduce the linewidth to approach the pressure broadened linewidth of the gas (around 0.01 nm).

Laser diodes pumping a gas saturated with alkali vapor may also be a very efficient method for creating a single-aperture diffraction-limited high-power (megawatt) laser beam for military defense applications. In a Diode Pumped Alkali Laser (DPAL), for example, a plurality of pump lasers illuminate a gas saturated with an alkali vapor at the D2 line, causing the atoms to populate the P3/2 second excited level. Collisions with gas atoms quench the P3/2 to the lower-lying P1/2 first excited level. A population inversion between this first-excited state and the ground state allows stimulated emission to occur, creating a lasing transition at the D1 line. This application would benefit from a bank of pump lasers with selectable central wavelength whose spectral width is narrowed close to the pressure broadened linewidth. Since the optimal operating pressure may be low, the amplifying medium may be long and narrow (e.g., perhaps a centimeter or less), and it may be desirable to pump the medium transversely, a pump system with a very high absorption cross section is desirable. Delivering all the pump power within a linewidth matching the pressure broadened linewidth of ~0.01 nm or even narrower may be desired.

Diode laser sources, such as diode array bars, used in high-power diode laser array systems provide wavelengths at 795 nm but with a broad 3 nm wide spectral output linewidth. Existing technologies used to select the central wavelength and narrow the spectral output of high-power diode laser array systems incorporate elements, such as a volume Bragg gratings (VBGs) or planar diffraction gratings, in an external lasing cavity to allow preferential feedback of the preferred wavelength. The laser linewidths currently available from both of these diffractive technologies are significantly broader than the pressure broadened absorption linewidth of the vapor in the applications mentioned above.

Atomic line filters (ALFs) provide passbands of about 0.001 nm and have been used to improve the background rejection of conventionally filtered laser receivers. In general, ALFs make use of narrow, sharp features in the spectra of atomic vapors (e.g., alkali metal vapors) to provide ultra-narrow optical passbands. ALFs have been based on the Faraday effect (i.e., Faraday filters) by rotating polarized light when it passes through a resonant vapor medium in the direction of an applied magnetic field. ALFs have also been based on the Voigt effect (i.e., Voigt filters) by transforming linearly polarized light into elliptically polarized light, finally becoming linearly polarized along the orthogonal direction.

Atomic line filters, particularly Faraday filters, have also been used in the external cavity of a diode lasing element to create a single mode laser in a closed-locked loop locked to the central wavelength of an atomic line. A unique challenge when using ALFs in the external cavity of such a laser is to assure that one of the allowed modes lies at the center of the atomic transition line and to assure that all of the laser energy is concentrated in this single mode. In one example of a single mode laser with an ALF, using a short external cavity baseline assures that the wavelength separation between longitudinal modes is large compared with the optical transition width of the ALF, and then feedback is provided to shift the back mirror position and adjust the length of the baseline to maximize the optical transparency of the atomic line filter.

SUMMARY

Consistent with an embodiment, a high power diode laser system includes at least one multi-mode diode laser source for generating at least one beam and a reflective surface forming an external cavity with the at least one multi-mode diode laser source. At least one atomic line filter is located within the external cavity between the at least one diode laser source and the reflective surface such that at least some power of the at least one beam is reflected from the reflective surface and fed back through the atomic line filter. The atomic line filter acts as a wavelength selective element in the external cavity to select a wavelength range of the multi-mode diode laser source.

Consistent with another embodiment, a high power diode laser system including a plurality of diode laser sources for generating a plurality of beams, respectively, and a reflective surface forming an external cavity with the plurality of diode laser sources. At least one atomic line filter is located within the external cavity between the plurality of diode laser sources and the reflective surface such that the plurality of beams pass through the atomic line filter and the atomic line filter acts as a wavelength selective element in the external cavity.

Consistent with a further embodiment, an external cavity assembly is provided for a high power diode laser system. The external cavity assembly includes a reflective surface forming an external cavity with the at least one diode laser source and an afocal telescope located within the external cavity between at least one diode laser source and the reflective surface and configured to image at least one beam at the reflective surface. At least one atomic line filter is located within the external cavity between the at least one diode laser source and the reflective surface. The afocal telescope images the at least one beam at the reflective surface after passing through the atomic line filter such that the atomic line filter acts as a wavelength selective element in the external cavity.

BRIEF DESCRIPTION OF THE DRAWINGS

These and other features and advantages will be better understood by reading the following detailed description, taken together with the drawings wherein.

DETAILED DESCRIPTION

Figure 1A:
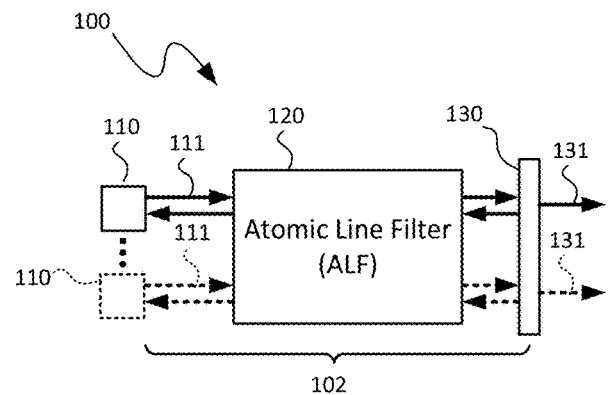
FIG. 1A is a schematic diagram of a high power laser diode system using an atomic line filter in an "in-line" or "straight through" configuration, consistent with embodiments of the present disclosure.

A high power diode laser system, consistent with embodiments of the present disclosure, selects the central wavelength and narrows the spectral bandwidth by employing one or more atomic line filters (ALFs) as the wavelength selective element in the external cavity to optimize high power multi-mode operation. In some embodiments, the high power diode laser system includes multiple diode laser sources, such as multiple diode laser bar stacks, providing multiple output beams. In an "in-line" or "straight through" configuration, a partially reflective surface terminates the external cavity to feed beam power back into the external cavity and to provide one or more output beams. In a "splitter" or "power divider" configuration, a highly reflective surface terminates the external cavity and one or more beam splitters between the diode laser source(s) and the ALF are used to provide one or more output beams. In some embodiments, an afocal telescope may be used to image the diode laser source(s) at the reflective surface terminating the external cavity.

The ALF may include an evacuated vapor cell containing alkali metal vapor (e.g., rubidium) and immersed in a magnetic field inserted into the optical path between two crossed polarizers. When warmed, the vapor cell is optically active, but only for wavelengths within a very narrow passband within the resonance line of the vapor. The linear polarization of light at that particular wavelength is rotated into the orthogonal direction and transmitted by the second polarizer. The reflective surface terminating the external cavity reflects only this wavelength, returning each emitter's beam back through the ALF to its source, increasing gain only for the wavelength selected by the atomic resonance line. Wavelengths outside this passband are rejected. The ALF may be based on Faraday rotation or Voigt rotation. Faraday rotation relies on an axial magnetic field, providing different indices of refraction for right and left circular polarization. Voigt rotation utilizes a transverse magnetic field, providing different indices of refraction for polarization parallel and perpendicular to the magnetic field.

In contrast to a single mode laser (typically 1 watt or less), the ALF is used in the high-power (e.g., 100 watts or more) diode laser system of the present disclosure as a gross wavelength-selective element to preferentially feedback a range of wavelengths within its bandpass to one or more diode laser sources. Using the ALF to select the central wavelength and narrow the spectral width of a high power diode laser system also allows a linewidth in the GHz range, rather than KHz or MHz, and avoids relying on the spacing of diffraction grating lines.

While a single mode laser uses an external cavity with a short baseline to allow longitudinal modes with large spacing, the multi-mode laser of the present disclosure may use an external cavity with a longer baseline to allow longitudinal modes that are closely spaced in frequency, assuring that the linewidth of the laser will more closely overlap with the linewidth of the vapor in a target. The afocal telescope may be used advantageously to image the diode laser source at the reflective surface in the external cavity for achieving high efficiency return of light along a longer baseline. Such a configuration with an afocal telescope may actually degrade the performance of a single mode laser that requires a shorter baseline, widely spaced longitudinal modes and selection of a signal longitudinal mode.

As used herein, "afocal telescope" refers to any combination of optical elements that are configured to provide magnification of a beam without producing net convergence or divergence of the beam. One example of an afocal telescope may be formed using two (spherical) converging lenses with different focal lengths and spaced by the sum of their focal lengths. The magnification is the ratio of the focal lengths. In some embodiments, an afocal telescope may include cylindrical optics such that magnifications are different in horizontal and vertical directions (e.g., in the slow axis and fast axis).

Embodiments of the high power diode laser system may be used for optically pumping alkali vapor mixed with gases, for example, in scientific, medical and military applications. In one example, embodiments of the high power diode laser system may be used for Spin Exchange Optical Pumping (SEOP) to illuminate gases in a pumping target. In another example, embodiments of the high-power diode laser system may be used with a diode pumped alkali laser (DPAL) as the pumping target.

Figure 1B:
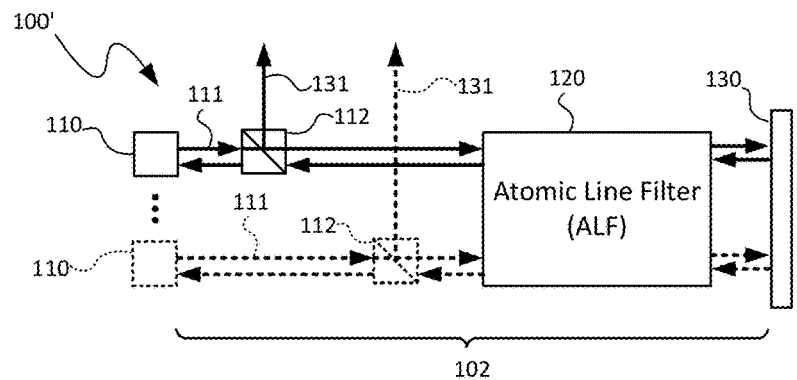
FIG. 1B is a schematic diagram of a high power laser diode system using an atomic line filter in a "splitter" or "power divider" configuration, consistent with other embodiments of the present disclosure.

Referring to FIGS. 1A and 1B, embodiments of a high-power diode laser system 100, 100' are shown and described in greater detail. The high-power diode laser systems 100, 100' include one or more multi-mode diode laser sources 110 for generating one or more beams 111, one or more atomic line filters (ALFs) 120 in an external cavity 102 for filtering the beam(s) 111, and a reflective surface 130 terminating the external cavity 102 for feeding at least a portion of beam power back through the ALF 120 to the diode laser source(s) 110. The gain for the modes and wavelengths passing through the ALF 120 will be increased at the expense of the other wavelengths and modes. The ALF 120 thus acts as a wavelength selective element in the external cavity 102 to select a wavelength range of the multi-mode diode laser source(s) 110.

The illustrated embodiments of the high-power diode laser system 100, 100' use different configurations to provide feedback and one or more output beams 131. In the high-power diode laser system 100, the reflective surface 130 is partially reflective (about 4% to 15% reflectivity) such that a portion of beam power is fed back into the external cavity 102 and a portion of beam power is transmitted as the output beam(s) 131, thereby providing a "straight through" or "in line" configuration. In the high-power diode laser system 100', the reflective surface 130 is highly reflective (i.e., at least 90% reflectivity) such that almost all of the beam power is fed back into the external cavity 102. The high-power diode laser system 100' includes one or more power dividers or beam splitters 112 in the cavity 102 between the diode laser source(s) 110 and the ALF(s) 120 to provide a portion of beam power into the ALF(s) 120 and to provide a portion of beam power as output beam(s) 131, thereby providing a "splitter" or "power divider" configuration. Thus, the reflective surface 130 may be a partially reflecting end mirror in the "straight through" or "in line" configuration and may be a fully reflecting plane mirror in the "splitter" or "power divider" configuration.

The multi-mode diode laser source 110 may include an array of laser emitters in a one-dimensional or two-dimensional arrangement (i.e., transverse to the optical axis) providing an array of beams 111 and the reflective surface 130 terminating the external cavity 102 returns each of the emitter beams 111 back onto itself. An afocal telescope (not shown in FIGS. 1A and 1B) may also be arranged in the external cavity 102 to form an image of the array of laser emitters on the reflective surface 130 after passing through the ALF 120, as will be described in greater detail below.

In one example embodiment, the diode laser source 110 includes a plurality of laser beam outputs arranged along an edge of a diode laser array bar. In another example, higher power may be obtained by arranging a plurality of bars in a stack of diode laser array bars as the diode laser source 110. In other examples, the high-power diode laser systems 100, 100' may include a plurality of laser sources 110 with an array of laser emitters, such as a plurality of diode array bar stacks. As such, the beams of a plurality of laser emitters may be transmitted through the ALF 120, reflect off the reflective surface 130, and pass back through the ALF 120 to narrow the several laser emitters. Since each laser source has its own separate path length, each will select several longitudinal modes from those available within the bandpass of the ALF 120. In contrast to a single mode laser, embodiments of the present disclosure benefit from the presence of multiple wavelengths produced from the combined system.

The ALF 120 may include a Faraday filter or a Voigt filter. In a Faraday filter, for example, a light beam is directed along the axis of a cell containing an alkali metal vapor. Crossed polarizers are provided at opposite ends of the cell and a magnetic field is applied axially in the direction of the beam. The crossed polarizers stop all light in the beam except light at wavelengths in the vicinity of the atomic transition, which passes the first polarizer and is rotated 90° inside the cell to pass the second polarizer.

An example of a Voigt filter includes a vapor cell in which alkali vapor is contained and maintained at a temperature of about 100° C. with a heating element, and a magnetic field of around 100 gauss in the vapor is provided. Two crossed polarizers, one front polarizer and one rear polarizer are placed at the entrance and exit of the cell, and the magnetic field is oriented transversely to the optical axis of the filter and 45° to the direction of both polarizers. For light traveling along the optical axis, the vapor is effectively resonantly birefringent near absorption lines. The vapor is used like a resonant half wave plate to obtain an ultra-narrow passband optical transmission filter.

The operating parameters of an atomic line filter are: (1) the choice of alkali metal vapor, (2) the vapor density, (3) the cell length and (4) the magnetic field intensity. Any of the strong absorption lines characteristic of alkali metal vapors (Li, Na, K, Rb or Cs) will provide the polarization rotation (Voigt or Faraday) effect in the presence of a magnetic field. The operating parameters may be chosen such that a phase retardance between electric field components of approximately one half wave occurs at wavelengths near the absorption line, either at the center or just outside, where transmission through the vapor cell is still high. For the Faraday effect, the two pure states are the two components of circular polarization, along and against the field. For the Voigt effect, they are the two components of plane polarization along and perpendicular to the magnetic field. In general, the retardance increases with density, length, and magnetic field strength.

One example of a Faraday filter may be based on the Rb-85 $D_2$ line and has a cell of about 7.5 cm long and operated at a density of $2 \times 10^{11}$ cm$^{-3}$ (Rb cell temperature of 54.4° C.) and a magnetic field of 223 gauss with a transmission of 96%. This example of the Faraday filter uses a solenoid coil to provide the magnetic field.

Figure 2:
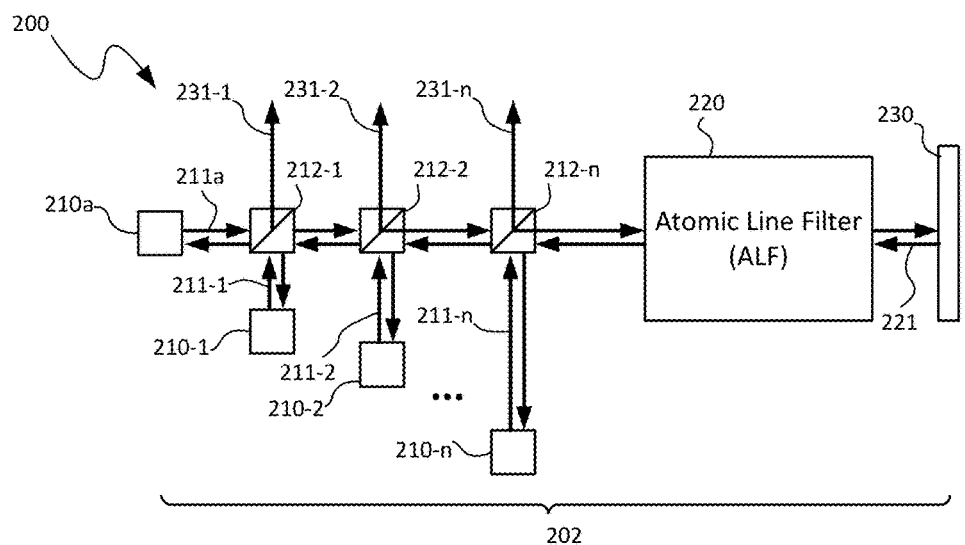
FIG. 2 is a schematic diagram of a high power laser diode system using an atomic line filter and including a plurality of multiplexed diode laser sources and an idler beam, consistent with yet another embodiment of the present disclosure.

Referring to FIG. 2, another embodiment of a high-power diode laser system 200 includes a plurality of diode laser sources 210-1 to 210-n, 210a multiplexed into an external cavity with at least one atomic line filter (ALF) 220. This embodiment of the high-power diode laser system 200 includes one or more intermediate or output-coupled diode laser sources 210-1 to 210-n emitting beams 211 and an end diode laser source 210a providing a transverse or idler beam 211a directed into the external cavity 202. One or more power dividers or beam splitters 212-1 to 212-n are arranged along the external cavity 202 to provide some beam power from the beams 211 into the cavity 202 and to provide some beam power from the beams 211 to associated output beams 231. The power dividers/beam splitters 212-1 to 212-n combine or multiplex the beams 211 and the idler beam 211a into the external cavity 202 and thus distribute seed photons to the diode laser sources 210-1 to 210-n and draw power from them into the cavity 202, thereby providing a power scaling approach.

As discussed above, the external cavity 202 is terminated by a highly reflective surface 230 (e.g., on a mirror) that reflects the merged beams 221 back into the cavity 202 and back through the ALF 220. The external cavity 202 may also include an afocal telescope (not shown) for imaging the diode laser sources 210-1 to 210-n through the ALF 220 and onto the highly reflective surface 230.

In this embodiment, the diode laser sources 210-1 to 210-n, 210a may include diode array bar stacks. An arrangement of beam splitters/power dividers arranged along an external cavity to distribute seed photons to several diode array bar stacks and to draw power from the stacks into the external cavity is disclosed in greater detail in U.S. Pat. No. 9,780,522, which is fully incorporated herein by reference.

In such an arrangement, several stacks of diode laser array bars are spectrally narrowed using a single external cavity.

Where several diode array bar stacks are to be spectrally narrowed by diverting light from a transverse or idler beam, the optical path length (e.g., from afocal telescope elements) to each of the diode array bar stacks should be essentially the same. In the illustrated embodiment in FIG. 2, the optical path length is made the same by staggering the intermediate diode laser sources 210-1 to 210-n such that they all will be in focus. In another embodiment, the optical path length may be made the same by using a stepped mirror to equalize the optical distance between the diode laser sources arranged in a single plane and a merged beam. In a further embodiment, transparent blocks may be used to select the optical path length required to achieve a focus, thereby equalizing the focal distance to produce images on the separate laser sources. Equalizing optical path lengths in an arrangement of multiple diode array bar stacks is also disclosed in greater detail in U.S. Pat. No. 9,780,522, which is fully incorporated herein by reference.

In other embodiments of a high-power diode laser system with multiple diode laser sources, one or more lenses may be used to form intermediate images of a diode laser source at intermediate locations where an additional and identical beam from a diode laser source can be introduced. Upright images and inverted images may serve as injection points for beams from additional sources to provide photons to and receive photons from the system. In some embodiments, an array of lenses may be used to focus, invert and reconstruct only portions of the 2-dimensional emission plane of the source. In other embodiments, the beam of only a single emitter or the beams of only a few emitters may be incorporated within the numerical aperture of the lens(es). This reimaging may also be performed only along the slow axis. The lenses may include full surface lenses (such as double convex, plano convex, and meniscus lenses), Fresnel-type lenses (which can reduce their thickness), or micro-lenses (arrays of multiple individual lenses etched into the surface of a glass plate).

Although the embodiment shown in FIG. 2 uses one idler beam, other embodiments may use multiple idler beams displaced transversely and longitudinally from one another, so that the locations where images are formed are more closely spaced. In these embodiments, the injection points may be sufficiently close together that gaps between laser sources may be substantially reduced, thereby allowing more spatial uniformity in the intensity of the output beam(s) and providing more uniform illumination of the target.

Figure 3:
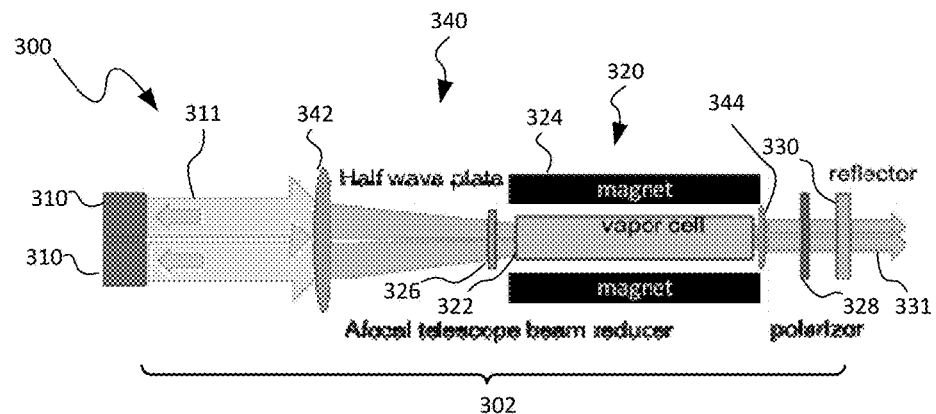
FIG. 3 is a schematic diagram of yet another embodiment of a high power laser diode system using an atomic line filter in an "in-line" or "straight through" configuration with an afocal telescope.
Figure 4:
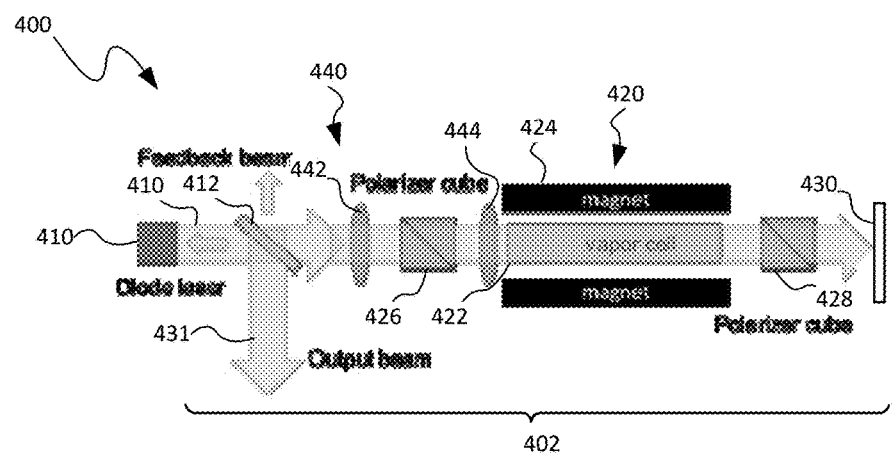
FIG. 4 is a schematic diagram of yet another embodiment of a high power laser diode system using an atomic line filter in a "splitter" or "power divider" configuration with an afocal telescope.

Referring to FIGS. 3 and 4, embodiments of a high-power diode laser system 300, 400 including ALFs 320, 420 and afocal telescopes 340, 440 are described in greater detail. The high-power diode laser system 300 uses a "straight through" or "in-line" configuration and includes diode laser bar stacks 310, an ALF 320, a reflector 330 (e.g., a partially reflecting end mirror) and an afocal telescope 340 that images the diode laser sources 310 at the reflector 330 after passing through the ALF 320. The ALF 320 includes a vapor cell 322 immersed in a magnetic field generated by magnets 324 and between polarizers 326, 328. In this embodiment, the polarizer 326 before the ALF 320 may include a half wave plate. The afocal telescope 340 may include lenses 342, 344 forming an afocal telescope beam reducer.

The high-power diode laser system 400 uses a "splitter" or "power divider" configuration and includes a diode laser bar stack 410 (e.g., a 10 bar diode array stack), a beam splitter or power divider 412, an ALF 420 (e.g., a Faraday filter), a fully reflecting plane mirror 430, and an afocal telescope 440. In this embodiment, the ALF 420 includes a vapor cell 422 within a magnetic field formed by magnets 424 (e.g., a solenoid coil) and between linear polarizers 426, 428. In this embodiment, the afocal telescope 440 includes lenses 442, 444 and provides a magnification M=1.

ALF vapor cells 322, 422 may be made from glass with glass end windows for the beam to pass through. In higher power implementations, however, other materials may be used to form the casing with glass windows for the light to pass through. If the magnetic field is produced outside the vapor cell, then a non-magnetic material is preferred for the casing of the vapor cell. In other embodiments, the elements producing the magnetic field may be inside the vapor cell enclosure or casing and there may not be a preference for non-magnetic materials. In other embodiments, the high-power diode laser systems 300, 400 may include multiple ALFs 320, 420 in series and/or the ALFs 320, 420 may include multiple vapor cells 322, 422 in series, as will be described in greater detail below.

The vapor cells 322, 422 of the ALFs 320, 420 may include several materials including, but not limited to, alkali metal vapors, as will be described in greater detail below. The ALF 320, 420 may also be configured to stabilize the alkali vapor concentration, for example, in cases where substantial power is dissipated in the ALF. In some embodiments, for example, a reservoir of liquid alkali metal may be largely contained in a protrusion or "nipple" of the vapor cell, allowing it to be located at some distance from the laser beams passing through the ALF. A separate thermal environment may be arranged to envelop this protrusion or nipple, making the temperature of the liquid largely independent from that of the vapor cell, which could become elevated due to heating. The alkali vapor concentration may thus have greater stability in cases where high power is used.

The beam output(s) from the high-power diode laser systems, consistent with embodiments disclosed herein, may have a spectral width that closely matches that of the optical pumping cell target and thus the gas used in the vapor cell of the ALF may be chosen based on the application. In some applications, buffer gas may be added to the vapor cell of the ALF, thereby broadening the atomic line. The pressure of the gas or gas mixture in the vapor cell may also be chosen so that the beam output spectral width is optimized for the application.

The choice of gas or gas mixture may also be determined by other considerations such as the thermal conductivity of the buffer gas if the system is operating at high power. Higher thermal conductivity of the gas allows increased heat exchange with the thermal reservoir and can result in greater stability of the alkali vapor concentration during operation. Helium gas, either helium-3 or helium-4, for example, provides excellent thermal conductivity. An additional consideration may be the quenching cross section of the gas for nonradioactive decay of excited states in the alkali vapor. For example, nitrogen gas is known to be efficient in quenching the first excited state, the p1/2 level, of rubidium vapor to the ground state. Inclusion of nitrogen in the gas mixture may be considered if such quenching is beneficial to the application but should be avoided if this quenching is detrimental to the application.

The vapor cell of the ALF may include an isotope or admixture of isotopes of the alkali vapor depending on the application. In cases where the alkali vapor is rubidium, two isotopes of rubidium exist in nature, rubidium-85 and rubidium-87, with slightly different transition wavelengths. An ALF that incorporates the naturally occurring mixture of these two isotopes will exhibit gain at various wavelengths corresponding to the different resonances. For some applications, a single isotope may be used. If the pumping target is exclusively one isotope such as Rb-85, for example, Rb-85 may be used for the atomic line filter.

In other applications, the target may be optically pumped using a wavelength that is slightly detuned from the peak of the resonance. For such applications, one isotope may be used in the atomic line filter, and the other isotope may be used in the pumping target. In still other applications, the target may be pumped with lines from both isotopes; however, the resonance that provides the greatest transparency to the atomic line filter will provide the highest feedback and dominate the gain for the diode laser. Nevertheless, this goal may be achieved if the beams from different emitters pass through the atomic line filter through segregated regions within the vapor cell such that some emitters experience feedback through regions of the atomic line filter where the isotope is rubidium-85 and other emitters experience feedback through regions where the isotope is rubidium-87. This may be accomplished by using separate cells or isolated cell regions, provided and maintained either in an evacuated state, at a single buffer gas pressure and mixture, or with different buffer gas pressures and mixtures.

Figure 5:
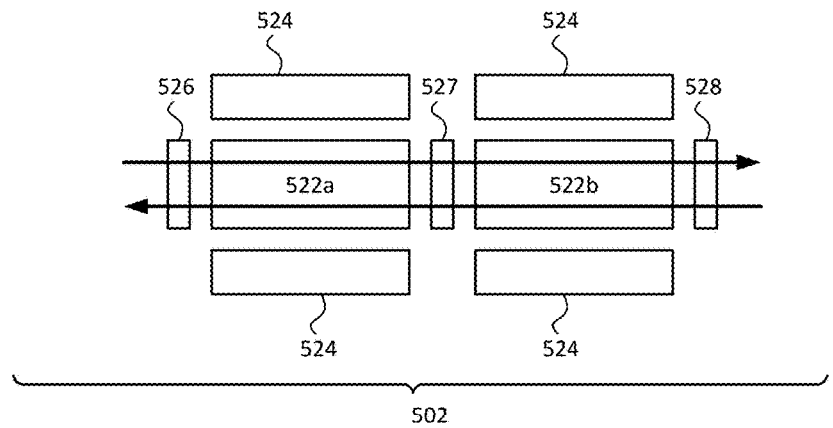
FIG. 5 is a schematic diagram of yet another embodiment of a high power laser diode system including a series of atomic line filters.

In other embodiments, a high-power diode laser system may be configured to select a wavelength near the resonance but tunably separated from it by a controllable amount of detuning. In such embodiments, two atomic line filters may be arranged in sequence within the external cavity. As shown in FIG. 5, for example, an external cavity 502 may include two ALF vapor cells 522a, 522b (e.g., two Faraday rotation cells) in series with different isotopes and with separate plane polarizers 526, 527, 528 to accomplish tunable wavelengths. The ALF vapor cells 522a, 522b may be located in a magnetic field generated by separate magnets 524 or the same magnet (e.g., a solenoid coil). In such an arrangement, the light polarization in the external cavity 502 is determined by a first plane polarizer 526, the polarization is rotated through the first atomic line filter vapor cell 522a with the first rubidium isotope and passes through a second plane polarizer 527, the polarization is then rotated through the second atomic line filter vapor cell 522b with the second rubidium isotope, and then passes through the final plane polarizer 528. The two ALF vapor cells 522a, 522b may have different pressures, temperatures, magnetic fields, rotation angles and/or physical lengths. In some embodiments, a unique wavelength may be found, either between the resonances of the two isotopes or in their vicinity, where the two atomic line filters achieve their highest transparency, such that lasing occurs at this wavelength where amplification is maximized. By adjusting the parameters of one or both ALFs, the selected wavelength can be caused to shift closer to or further from the resonances.

The dichroic dispersion in the vicinity of an atomic line transition between two energy levels can be accomplished for excited state transitions if a sufficient population of the lower excited level can be maintained in the atomic line filter cell. It is well known that optical pumping of a cell containing rubidium vapor can achieve a significant fraction of the atoms in an upper level. For example, optically pumping the vapor cell at the D2 line can produce a significant population of the p3/2 level, and likewise, optically pumping the D1 line can produce and maintain a significant population of atoms in the p1/2 level. This population of excited-state atoms will provide a medium for anomalous dispersion for transitions originating at that level and terminating on higher levels. This effect can be employed in an atomic line filter being used in the external cavity of a high power diode laser system to select beam outputs at wavelengths corresponding to these higher transitions. Such a system could be combined with a laser operating at the lower transition to deliver pump beam energy at two wavelengths specifically chosen for two-photon up-conversion. By absorbing two photons at the selected wavelengths, the atoms in the target can be elevated to a highly excited state, and then produce shorter wavelength light (blue light) in their subsequent decay, through a process called four wave mixing.

High power diode laser systems also use methods for stabilizing the temperature. Although the atomic line filter achieves its benefit through magnetic dichroism, it is also operating in an optical region where power is absorbed by the medium. Some portion may be dissipated locally while some portion may be reradiated. In the vapor cell of the atomic line filter, the optical properties are determined by the alkali vapor density, which in turn is determined by the temperature. The cell may be thermally stabilized by preferentially arranging that the reradiated portion is transferred to a reservoir, while the dissipated portion may be removed using a buffer gas in the vapor cell with high thermal conductivity, as discussed above.

Convection or advective flow of the gas can also benefit heat transfer and thermal stability. Convection can be enhanced by gravitational buoyancy by designing the vapor cell as a loop, such that one arm of the loop is heated, causing a reduction in the density leading to upward flow, and a second arm (or region) of the loop is cooled by a thermal reservoir. Heat transport is enhanced by subsequent circulation. In cases with large heat removal and/or stability requirements, the flow can be forced by mechanical means, compressors, impellers, or pumps. In some implementations, the internal structure of the ALF may include fins between the beams of the several diode laser elements.

Accordingly, high-power diode laser systems, consistent with embodiments disclosed herein, use atomic line filters to select a central wavelength and narrow the linewidth and thus are capable of providing the narrow linewidth and multi-mode diode operation desired for certain applications.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:
1. A high power diode laser system comprising:
at least one multi-mode diode laser source for generating at least one beam;
a reflective surface forming an external cavity with the at least one multi-mode diode laser source; and
at least one atomic line filter located within the external cavity between the at least one diode laser source and the reflective surface such that at least some power of the at least one beam is reflected from the reflective surface and fed back through the atomic line filter, wherein the atomic line filter acts as a wavelength selective element in the external cavity to select a wavelength range encompassing multiple modes of the multi-mode diode laser source.

2. The high power diode laser system of claim 1 further comprising:
an afocal telescope located within the external cavity between the at least one diode laser source and the reflective surface and configured to image the at least one beam at the reflective surface after passing through the atomic line filter.

3. The high power diode laser system of claim 1 wherein the reflective surface is partially reflective and reflects a portion of beam power back toward the at least one diode laser source and transmits a portion of beam power to provide an output beam.

4. The high power diode laser system of claim 1 further comprising at least one beam splitter between the at least one diode laser source and the at least one atomic line filter, wherein the at least one beam splitter provides a portion of beam power into the external cavity and provides a portion of beam power as an output beam, and wherein the reflective surface forming the external cavity is highly reflective.

5. The high power diode laser system of claim 1 wherein the atomic line filter is a Faraday filter.

6. The high power diode laser system of claim 1 wherein the atomic line filter is a Voigt filter.

7. The high power diode laser system of claim 1 wherein the at least one diode laser source includes a plurality of diode laser sources.

8. The high power diode laser system of claim 7 wherein the plurality of diode laser sources are multiplexed into the external cavity.

9. The high power diode laser system of claim 7 further including at least two beam splitters between at least two of the plurality of diode laser sources, respectively, and the atomic line filter, wherein the at least two beam splitters are configured to provide a portion of beam power from respective beams emitted by the at least two diode laser sources, respectively, into the external cavity and to provide a portion of beam power from the respective beams as output beams, wherein at least one of the plurality of diode laser sources emits an idler beam into the external cavity.

10. The high power diode laser system of claim 1 wherein the least one diode laser source includes at least one diode laser bar.

11. The high power diode laser system of claim 1 wherein the at least one diode laser source includes at least one diode laser bar stack.

12. The high power diode laser system of claim 1 wherein the at least one diode laser source includes a plurality of diode laser bar stacks.

13. The high power diode laser system of claim 1 further comprising a plurality of atomic line filters in the external cavity.

14. A high power diode laser system comprising
a plurality of diode laser sources for generating a plurality of beams, respectively;
a reflective surface forming an external cavity with the plurality of diode laser sources; and
at least one atomic line filter located within the external cavity between the plurality of diode laser sources and the reflective surface such that the plurality of beams pass through the atomic line filter and the atomic line filter acts as a wavelength selective element in the external cavity.

15. The high power diode laser system of claim 14 wherein the plurality of diode laser sources include a plurality of diode array bar stacks.

16. The high power diode laser system of claim 14 wherein the plurality of diode laser sources are multiplexed into the external cavity.

17. The high power diode laser system of claim 14 wherein the plurality of diode laser sources are staggered such that the plurality of beams all remain in focus.

18. The high power diode laser system of claim 14 wherein at least one of the diode laser sources is an end diode laser source for originating an idler beam and wherein at least one of the diode laser sources originates an output-coupled beam, and further including at least one beam splitter configured to provide a portion of beam power from respective beams originated by the end diode laser source and the output-coupled diode laser source, respectively, into the external cavity and to provide a portion of beam power originating from the output-coupled diode laser sources as output beams.

19. The high power diode laser system of claim 14 wherein the atomic line filter is a Faraday filter.

20. The high power diode laser system of claim 14 wherein the atomic line filter is a Voigt filter.

21. The high power diode laser system of claim 14 wherein the atomic line filter includes at least one vapor cell.

22. The high power diode laser system of claim 21 wherein the at least one vapor cell includes alkali metals.

23. The high power diode laser system of claim 21 wherein the at least one vapor cell includes an isotopic admixture of alkali vapor.

24. The high power diode laser system of claim 21 wherein the at least one vapor cell includes a plurality of vapor cells including different isotopic admixtures.

* * * * *